Figure 1:
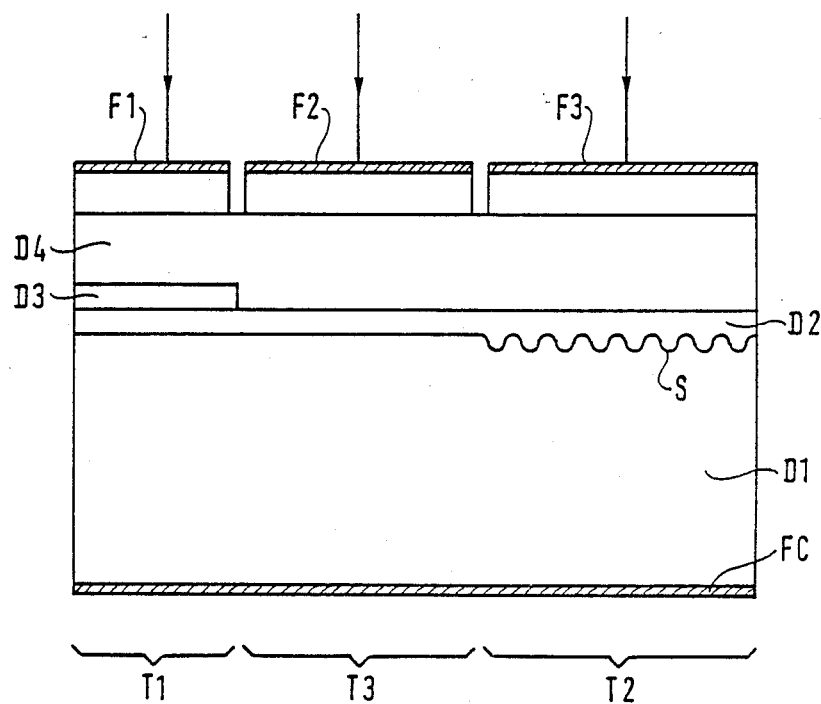

United States Patent [19]

Brosson et al.

[11] Patent Number: 4,920,542
[45] Date of Patent: Apr. 24, 1990

[54] TUNABLE SEMICONDUCTOR LASER

[75] Inventors: Philippe Brosson, Forges Les Bains; Joël Jacquet, Orsay; Claude Artigue, Paris; Denis Leclerc, Bourg La Reine; Jacques Benoit, Orsay, all of France

[73] Assignee: Alcatel N.V., Amsterdam, Netherlands

[21] Appl. No.: 351,893

[22] Filed: Mar. 22, 1989

[30] Foreign Application Priority Data

Nov. 25, 1988 [FR] France .................. 88 15467

[51] Int. Cl.⁵ .............................................. H01S 3/19
[52] U.S. Cl. ........................................ 372/50; 372/20; 372/26; 372/96
[58] Field of Search .................... 372/50, 96, 20, 26

[56] References Cited

U.S. PATENT DOCUMENTS

| 4,665,528 | 5/1987 | Chinone et al. | 372/96 |
|---|---|---|---|
| 4,680,769 | 7/1987 | Miller | 372/50 |
| 4,710,914 | 12/1987 | Robieux | 370/3 |
| 4,719,636 | 1/1988 | Yamaguchi | 372/50 |
| 4,775,980 | 10/1988 | Chinone et al. | 372/96 |
| 4,788,690 | 11/1988 | Akiba et al. | 372/50 |
| 4,802,187 | 1/1989 | Bouley et al. | 372/96 |
| 4,815,090 | 3/1989 | Usami et al. | 372/49 |

FOREIGN PATENT DOCUMENTS

| 246959 | 11/1987 | European Pat. Off. | |
|---|---|---|---|
| 59-155983 | 9/1984 | Japan | |
| 0079283 | 4/1986 | Japan | 372/96 |
| 0220389 | 9/1986 | Japan | 372/50 |

OTHER PUBLICATIONS

"Monolithic 1.5 μm Hybrid DFB/DBR Lasers with 5 nm Tuning Range", Westbrook et al., Appl. Phys. Lett. 52, p. 1285, Apr. 1988.
"Widely Tunable Active Bragg Reflector Integrated Lasers in InGaAsP-InP", Broberg et al., Appl. Phys. Lett. 52, p. 1285, Apr. 1988.
"Tunable DBR Laser with Wide Tuning Range", Kotaki et al., Elect. Lett. 24, p. 503, Apr. 1988.
"Influence of Isolation Resistance on Spectral Linewidth in Wavelength Tunable DBR Laser", Kotaki et al., Int'l. Conference on Semiconductor Laers, p. 128, Boston, Sept. 1988.
"Wavelength Stabilization of 1.5 μm GaInAsP/InP Bundle-Integrated-Guide Distributed-Bragg-Reflector (BIG-DBR) Lasers Integrated with Wavelength Tuning Region", Tohmori et al., Elect. Lett. 22, p. 138, Jan. 1986.
"1.55 μm Wavelength Tunable FBH-DBR Laser", Kotaki et al., Elect. Lett. 23, p. 325, Mar. 1988.
"Broad Wavelength Tuning Under Single-Mode Oscillation with a Multi-Electrode Distributed Feedback Laser", Yoshikuni et al., Electr. Lett. 22, p. 1153, Oct. 1986.
"Wavelength Tuning of GaInAsP/InP integrated Laser with Butt-Jointed Built-In Distributed Bragg Reflector", Tohnori et al., Elect. Lett. 19, p. 656, Aug. 1983.
"Tunable Ranges for 1.5 μm Wavelength Tunable DBR Lasers", Murata et al., Elect. Lett. 24, p. 577, May 1988.
"1.5 μm Wavelength Tunable DBR Lasers with Large Continuous Tuning Ranges and Narrow Spectral Linewidths", Murata et al., Int'l. Conf. on Semiconductor Lasers, p. 122, Boston, Sept. 1988.
"Lasing Mode & Spectral Linewidth Control by Phase Tunable Distr. Feedback Laser Diodes w/ Double Channel Planar Buried Heterostructure (DFB-D-C-PBH LD's)", Kitamura et al., IEEE J. Quant. Elect. QE-21, p. 415, May 1985.

(List continued on next page.)

Primary Examiner—William L. Sikes
Assistant Examiner—Georgia Y. Epps
Attorney, Agent, or Firm—Christie, Parker & Hale

[57] ABSTRACT

A tunable multisection laser of the invention includes an active layer (C2) which is thicker in a phase tuning section (S3) and in a grating section (S2) including a Bragg distributed reflector (R) having a controllable equivalent pitch than it is in a light amplification section (S1). The invention is particularly applicable to making components for telecommunications by means of optical fibers.

10 Claims, 2 Drawing Sheets

OTHER PUBLICATIONS

"Over 720 Ghz (5.8 nm) Frequency Tuning by a 1.5μ DBR Laser with Phase & Bragg Wavelength Control Regions", Murata et al., Elect. Lett. 23, p. 403, Apr. 1987.

"High Performance Tunable 1.5 μm InGaAs/InGaAsP Multiple-Quantum-Well", AT&T Bell Labs., N.J., Int'l. Conf. on Semiconductor Lasers, p. 120, Boston, 1988.

"Spectral Characteristics for a 1.5 μm DBR Laser with Frequency-Tuning Region", Murata et al., IEEE J. Quant. Electron QZ-23, p. 835, June. 1987.

"Frequency Modulation and Spectral Charactristics for a 1.5 μm Phase-Tunable DFB Laser", Murata et al., Electr. Lett. 23, p. 12, Jan. 1987.

Jacquet et al., *Theoretical Investigation of a Three-Section Laser Providing Monomode Emission which is Continuously Tunable in Wavelength,* Journées Nationales d'Optiques Guidée, Lannion (France), 24 Mar. 88.

Jacquet et al., "Etude Théorique D'un Laser à Trois Sections Permettant une Émission Monomode Continû ment Accordable en Longueur d'onde", Journeés Nationales d'Optiques Guideé, Lannion (France), 24 Mar. 88.

TUNABLE SEMICONDUCTOR LASER

The present invention relates to a light source constituted by a laser and it is applicable, in particular, to optical fiber telecommunications systems. In such systems, it is well known that the use of coherent detection makes it possible to obtain a considerable increase both in transmission capacity and in the distance between repeaters, however such a detection system requires monochromatic light sources to be used which can be tuned in wavelength. This ability to tune the source is necessary so that the wavelength specific to the source which constitutes the local oscillator can be matched to the wavelength of the transmission oscillator. It is also necessary for such sources to produce very narrow spectrum lines in order to ensure that effective coherent detection can take place.

Particularly with respect to obtaining the desired increase in data transmission capacity, one known technique consists in using light frequency multiplexing simultaneously with coherent detection. Since the sources used can be tuned in wavelength, it becomes possible to control the light frequencies of the carrier wave and of the local oscillator by electrical means. A large tuning range is therefore desirable in order to increase the number of channels.

That is why the need has been felt over more than five years for an integrated optoelectronic component having a wide continuous wavelength tuning range, preferably combined with narrow spectrum line width, for the purpose of making such sources. The resulting research has given rise to numerous publications and a list thereof is given at the end of the present description, with most of the publications in the list examining the width of the resulting spectrum line.

The present invention is particularly applicable to implementing the invention of J. Robieux concerning multiplexing at light frequencies (French patent number 2 586 874).

A tunable monochromatic light source may be constituted by a distributed feedback semiconductor laser, referred to as "DFB laser". The principle on which this type of laser operates is described, in particular, in the publication by C. Artigue, Y. Louis, F. Poingt, D. Sigogne, and J. Benoit entitled "Low threshold second order DFB laser emitting at 1.3 microns for high bit rate applications" appearing in Proc. IOOC-ECO"85, Venezia, Italy, 33, 1985.

In theory, a DFB laser emits on a single mode and with a narrow spectrum line in the vicinity of a wavelength referred to as the "Bragg" wavelength. The emission wavelength is entirely determined by the equivalent wavelength of the active material constituting the active layer of the laser, i.e. the wavelength of light that is suitable for being amplified in said material; the pitch of the diffraction grating engraved on a passive layer adjacent to the active layer; and the effective refractive index n of the laser mode, i.e. the index as seen by the light which is guided in the waveguide constituted by said active and passive layers, said effective index depending on the thicknesses and on the refractive indices of the various layers through which the light travels. In order to be tunable, such a laser is said to be of the multisection type.

One such multisection DFB laser has been proposed by Murata (S. Murata, I. Mito, K. Kobayashi, "Tuning ranges for 1.5 micron wavelength tunable DBR lasers") Electron. Lett., Vol. 24, p. 577, 1988. This laser is referred to below as the "first prior art laser". It includes various essential items which are common to this prior art laser and to a laser of the present invention, said items being common at least with respect to those of their functions which are specified. These essential items in common are now described in order to specify a typical technical context in which the present invention can be situated:

a monolithic semiconductor plate extending along a longitudinal direction and constituted by layers of various compositions and thicknesses, said thicknesses being superposed in a superposition direction, said layers extending and/or following one another along said longitudinal direction and along a transverse direction, and constituting:

an internal light guide extending along said longitudinal direction and interposed in said superposition and transverse directions between confinement layers having lower refractive indices so as to guide a light beam propagating along said longitudinal direction, said light beam itself including at least one active layer in which a forbidden energy band is narrower than in the adjacent layers, first and second ones of said confinement layers having first and second conductivity types such that if electrical injection currents pass from one of these two layers to the other, said currents pass through said light guide causing densities of free carriers to appear therein suitable for giving rise to optical gain therein and/or for controlling a refractive index therein; and three sections which follow one another said longitudinal direction and which comprise:

an amplification section in which said active layer has an amplification thickness suitable for enabling said light to be amplified;

a phase tuning section; and a grating section which is situated at a first end of said light guide and in which the thickness of the grating layer belonging to said light guide varies in alternation along said longitudinal direction in order to constitute a diffraction grating having a pitch and so that said grating contributes to forming a distributed Bragg reflector for said light having a controllable equivalent pitch, with the ratio of said equivalent pitch to said grating pitch being controllable by means of the controllable refractive index of a control layer of said light guide in said grating section;

said laser also including:

amplification electrodes disposed in said amplification section in order to cause an amplification current to pass, said current constituting one of said injection currents in order to cause positive optical gain to appear in said active layer suitable for creating and/or amplifying said light;

phase tuning electrodes disposed in said phase tuning section in order to pass a phase tuning current which constitutes one of said injection currents for controlling the refractive index of said control layer, thereby controlling the optical length of said phase tuning section relative to said light;

grating control electrodes disposed in said grating section in order to pass a grating control current which constitutes one of said injection currents in order to control said equivalent pitch of said distributed reflector; and a second reflector at a second end of said light guide at a distance from said grating section suitable for constituting a laser oscillator for emitting one of said light beams having a central frequency which can be controlled by means of the value of said grating control current, with stable monomode operation of said oscillator being obtainable by controlling a corresponding value of said phase tuning current.

This first prior art laser has the following additional dispositions which are common thereto and to the above-mentioned laser of the invention:

said light guide further includes a passive layer which extends over the entire length of said guide and which constitutes said grating layer in said grating section; and a first one of said confinement layers having a first one of said conductivity types, said active layer, said passive layer, and a second one of said confinement layers having a second one of said conductivity types opposite to the first following one another along said superposition directions.

This first prior art laser is shown in FIG. 1. It comprises, in succession, along said superposition direction, a common electrode FC, a first confinement layer D1, a passive layer D2, an active layer D3, a second confinement layer D4, and three electrodes which are superposed on low resistivity contact layers and comprising an amplification electrode F1, a grating control electrode F2, and a phase tuning electrode F3. In the longitudinal direction, it comprises the amplification section T1 which contains the entire active layer, the phase tuning section T3 and the grating section T2 which contains a diffraction grating S formed in the layer D2.

Wavelength tuning is obtained by controlling the control current for the grating in section T2.

The free carriers, i.e. the charge carriers injected in this way into the section T2, have the effect of reducing the refractive index of the layer D2 by a plasma effect, thereby varying its effective index. This variation in the effective index corresponds to an approximately proportional variation in the Bragg wavelength. The passive layer D2 in this section thus constitutes the above-mentioned control layer. The phase tuning current serves to adjust the phase by acting on the effective index of the layer D2 in section T3 of said layer, which also constitutes the control layer at that position. This phase adjustment makes it possible to obtain monomode emission at the Bragg wavelength determined as mentioned above by the grating control current. The current in the amplification section T1 is adjusted so as to maintain a constant output optical power level.

This laser has made it possible to obtain continuous tuning over a range of 4.4 nm in the vicinity of 1500 nm and with an output power of 1 mW. However, at a power of 5 mW, this range is reduced to 2.8 nm. This reduction in tuning range as a function of power has two consequences: firstly it limits the number of channels when using wavelength multiplexing; secondly it prevents the use of high power and therefore makes it impossible to obtain a narrow spectrum line since spectrum line width is inversely proportional to laser power.

Further, when the grating control current is increased in order to change wavelength, optical losses in the sections T2 and T3 increase because light is absorbed by the free carriers. This gives rise to heating which increases the refractive index, thereby opposing the reduction due to the plasma effect. These two opposing contributions set the limit on wavelength variation.

In addition, for large variations in wavelength, light losses in the sections T2 and T3 greatly increase the threshold value of the amplification current, which value is commonly called the "laser threshold current" and it rises from 18 mA to 70 mA.

Other prior art semiconductor lasers are also incapable of obtaining a continuous tuning range which is as wide as could be desired.

Three of the present inventors have also proposed a tunable semiconductor laser of the type mentioned above at the symposium "Journées Nationales d'Optique Guidée" which took place at Lannion (France) starting Mar. 24, 1988.

In this laser, the active layer extended not only over the amplification section (then called the laser section) but also over the phase tuning section (then called the phase control section), and the grating section (then called the wavelength tuning section).

A particular object of the present invention is to make it possible to tune a monochromatic semiconductor laser over a wider range, with said tuning being continuous, and/or to reduce the spectrum line width of the light emitted by said laser.

A multisection DFB laser of the present invention is characterized by the fact that the thickness of the active layer is increased in a phase tuning section and/or in a section provided with a distributed reflector.

A non-limiting example of a laser in accordance with the present invention is described below in greater detail with reference to accompanying diagrammatic FIG. 2.

FIG. 1 has already been described and is a section view through the above-mentioned first prior art laser, with the section being in a vertical longitudinal plane, said superposition direction being vertical.

Figure 2:
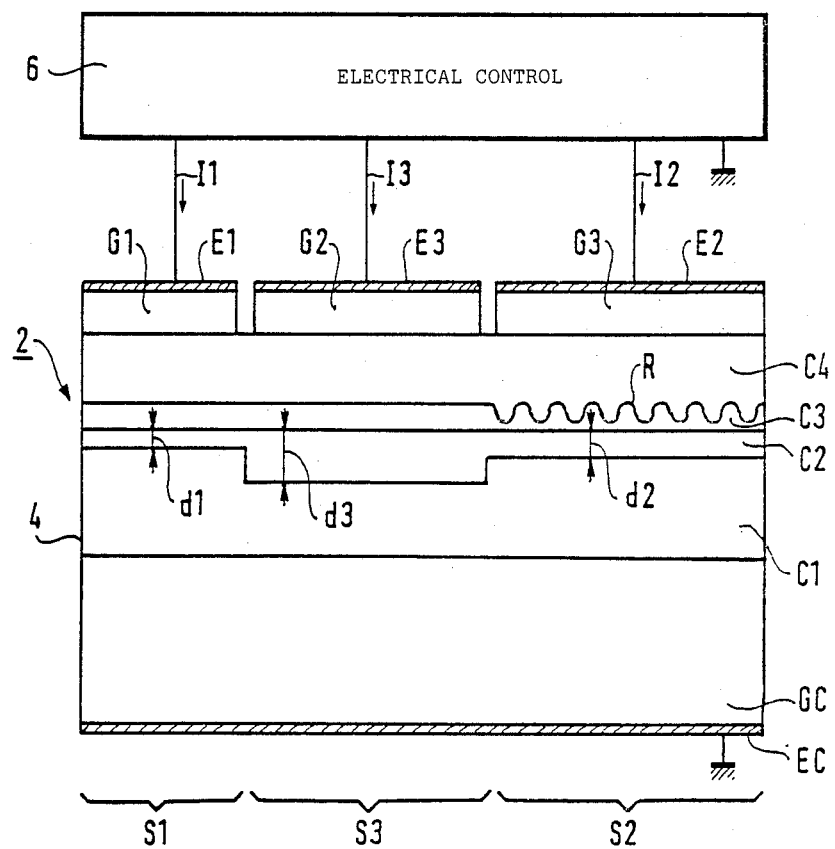

FIG. 2 is a section view through a laser of the present invention with the section being on a vertical longitudinal plane.

The laser of the present invention shown in FIG. 2 comprises the above-mentioned common essential items, and in particular a monolithic semiconductor plate 2. This plate is constituted by layers C1, C2, C3, and C4, said light guide C2, C3 being interposed in said superposition direction between two of said confinement layers C1 and C4, and in said transverse direction between two lateral confinement layers (not shown). Said active layer of said light guide is represented by C2 and its forbidden energy band is narrower than in the layers C1 and C3 which are adjacent thereto in said superposition direction, and in the adjacent layers (not shown) in said transverse direction. The confinement layers C1 and C4 have said opposite conductivity types.

The three sections are as follows:

an amplification section S1;

a phase tuning section S3; and a grating section S2 in which the grating layer C3 constitutes a diffraction grating having a pitch and contributing to forming a distributed Bragg reflector R. The ratio of the equivalent pitch of said reflector to the specific pitch of said grating is controllable by controlling the controllable refractive index of a control layer which, in this case, is the active layer C2.

The amplification electrodes are electrodes E1 and EC.

The phase tuning electrodes are electrodes E3 and EC, and they pass a phase tuning current for controllng the refractive index of the layer C2 which, in this case, also constitutes said control layer.

The grating control electrodes are referenced E2 and EC and said second reflector is referenced 4, said second reflector being constituted by a cleaved end face of the chip 2.

The electrodes E1, E2, E3, and EC are constituted by metal deposits formed on high conductivity layers G1, G2, G3, and GC respectively which belong to the plate 2, with the electrode EC and the layer GC being common to all three sections S1, S2, and S3.

The electrodes are connected to electrical feed means 6 suitable for delivering said amplification, phase tuning, and grating control currents at values suitable for ensuring said amplification in said amplification section S1, and for avoiding said light being amplified in said phase tuning section S3 and in said grating control section S2.

This laser also includes the above-mentioned common dispositions, i.e.:

in addition to the active layer C2, said light guide includes a passive layer C3 which extends over the entire length of said light guide and which constitutes said grating layer in said grating section (S2); and the layers C1, C3, and C4 succeed one another in said superposition direction.

In accordance with a characteristic disposition, the thickness of the active layer C2 is greater than said amplification thickness in at least one of said phase tuning section S3 and said grating section S2 in order to constitute said control layer therein and in order to confer a wider tuning range and/or a reduced spectrum line width to the laser.

In accordance with a preferred and more particular disposition, the increased thickness of the active layer in each of said phase tuning section and said grating section is such as to confer both a wider continuous tuning range and a narrower spectrum line width to the laser, simultaneously.

Such a laser avoids some of the drawbacks of the above-mentioned first prior art laser by making appropriate use of the "abnormal dispersion" effect in order to change the refractive index instead of using the plasma effect which is two or three times smaller. This abnormal dispersion effect is known elsewhere. Implementing it requires these sections S2 and S3 to include an active layer, i.e. a layer constituted by the same material as in the amplification section, or at least by a material enabling light to be amplified. The thermal effects related to absorption by free carriers are then greatly reduced since the same change in wavelength can be obtained by injecting many fewer carriers than before. However, when the injection current is increased sufficiently for one or other of the sections S2 or S3 to begin amplifying the light, then the density of carriers injected into said section saturates and this gives rise to saturation in wavelength variation. However, by virtue of the present invention, this limit is higher than in the first prior art laser.

In order to obtain a given variation in wavelength $\delta\lambda$, the current I2 injected into the section S2 must satisfy the equation:

$$\delta\lambda = \lambda_B \Gamma_2 \frac{1}{N_2} \frac{d\mu_2}{dN_2} \sqrt{\frac{I_2}{ed_2 B L_2 W_2}} \quad (1)$$

where:

$\lambda_B$ is the Bragg wavelength;

$\mu_2$ and $\mu_3$ are the refractive indices in the sections S2 and S3;

$n_2$ and $n_3$ are the effective indices in sections S2 and S3;

$N_2$ and $N_3$ are the free carrier densities in the sections S2 and S3;

$L_1$, $L_2$, and $L_3$ are the lengths of sections S1, S2, and S3;

$\Gamma_2$ and $\Gamma_3$ are the optical confinements in the sections S2 and S3

$$\frac{d\mu_2}{dN_2} = 15 \times 10^{-21} \text{ cm}^3$$

is the variation of refractive index with density of carriers injected into section S2.

$d_2$, $W_2$ are the thickness and the width of the active layer in section S2

$d_3$ is the thickness of said layer in section S3

B is the effective recombination coefficient e is the charge of an electron.

Monomode emission at the wavelength defined in this way is obtained by adjusting the current I3 injected in the section S3 in such a manner as to satisfy the phase tuning condition $$(L_2+L_3)\gamma_2\delta\mu_2 = L_3\Gamma_3\delta\mu_3 \quad (2)$$

The variations in refractive index $\delta\mu_2$ and $\delta\mu_3$ are the variations in the indices $\mu_2$ and $\mu_3$ and are related to the currents I2 and I3 by the equations $$\delta\mu_1 = \frac{d\mu_i}{dN_i} \sqrt{\frac{I_i}{ed_i B L_i W_i}} \quad (3)$$

where i=2, 3.

In the present invention, the tuning limit is increased by increasing the thickness of the active layers in sections 2 and 3 in order to increase the optical confinements $\Gamma_2$ and $\Gamma_3$.

It may be observed that the considerable variation in index, and thus in wavelength tuning range due to the abnormal dispersion effect is known, per se, from a publication by Broberg et al (APL 52, p. 1285, April 1988) which describes a two-section laser. This laser exhibits mode skips and it has a discontinuous tuning range of 9.8 nm.

It may also be observed that a wider tuning range has been obtained (Murata et al, Elect. Lett., 24, p. 577, May 1988) by increasing the thickness of the passive layer D2 (FIG. 1) when tuning is obtained by the plasma effect in this layer. However, free carrier absorption then gives rise to tuning being saturated by thermal effects when the thickness of the passive layer is increased.

When tuning is obtained, according to the invention, by the abnormal dispersion effect, then this increase is obtained by means of an active layer which is thicker in its phase tuning section and its grating control section, and in which thermal limits are must less important than when tuning is obtained by the plasma effect. However, a new tuning limit is reached in this case, as mentioned above, when the free carrier density reaches a laser threshold in one or other of the sections S2 or S3, said threshold being the threshold beyond which positive gain appears for light, i.e. amplification takes place. When the laser threshold is reached, the carrier density in the corresponding section can no longer increase and the refractive index cannot be varied any further. In order to ensure that this limit is reached simultaneously in both sections 2 and 3, $\delta\mu_2$ can be made to be equal to $\delta\mu_3$. In ths case, equation (2) reduces to $$\Gamma_2 = \frac{L_3}{L_1 + L_3} \Gamma_3 \quad (4)$$

According to equation (1) the greater $\Gamma_2$ (i.e. the greater the thickness $d_2$), the greater the tuning range. From this point of view, the thickness $d_3$ may be selected to be smaller than $d_2$, however it may also be chosen to be equal to $d_2$ in order to simplify laser manufacture.

Nevertheless, the thicknesses $d_2$ and $d_3$ cannot be increased beyond the cut-off of the second transverse mode (430 nm) in order to maintain transverse monomode transmission. If this value is selected for $d_3$, then $\Gamma_3 = 0.80$, and by choosing $L_1 = 100$ micrometers and $L_3 = 800$ micrometers, equation (4) gives $\Gamma_2 = 0.63$, and thus gives a thickness $d_2 = 290$ nm.

The thickness $d_1$ of the active layer in the amplification section, i.e. said amplification thickness, is preferably selected to be about 150 nm in order to minimize the threshold current. Under these conditions, the theoretical limit on continuous tuning is 7 nm.

These numerical values obtain for the case where the layers C1, C2, C3, and C4 have the folowing equivalent wavelengths and compositions:

| Layer | Wavelength in Micrometers | Composition |
|---|---|---|
| C1 | 0.92 | Inp |
| C2 | 1.55 | $Ga_{0.42} In_{0.58} A_{30.90} P_{0.10}$ |
| C3 | 1.35 | $Ga_{0.31} In_{0.60} A_{30.68} P_{0.32}$ |
| C4 | 0.92 | Inp |

The currents I1, I2, and I3 may then have have the following values: 20 mA to 40 mA; 50 mA; and 80 mA.

With respect to the indications given above, it appears to be preferable, at least in some cases, to adopt one or other of the following dispositions for the thickness of the active layer in the phase tuning section, with both of these dispositions being adopted in the laser described by way of example:

This thickness is not less than 150% of said amplification thickness.

This thickness is greater than 300 nm, with said amplification thickness being less than 200 nm.

This thickness lies between 15 and 25% of the wavelength of light suitable for being amplified in the material of said layer present in said material.

However, it should be understood that the present invention is equally applicable to other cases where the layers have compositions and equivalent wavelengths which are very different from the compositions and values given above, for example in order to make a source which is usable in a telecommunications system having optical transmission fibers with maximum transparency at wavelengths that are not used industrially at the time of the present invention.

In addition, the active layer may be constituted by a multiple quantum well with separate confinement, which should make it possible to obtain greater tuning effectiveness together with a narrower spectrum line.

There follows a list of publications as mentioned above. These publications are grouped together depending on the firms or laboratories from which they come. Those that relate to spectrum line width are marked with the symbol *.

ATT Bell (International Conference on Semiconductor Lasers, p. 120, Boston 1988)*

NEC (Murata, et al, IEEE J. Quant. Electron QZ-23, p. 835, June 1987)*

(Murata, et al, Electr. Lett. 23, p. 12, January 1987)*

(Kitamura et al, IEEE J. Quant. Elect., QE-21, p. 415, May 1985)*

(Murata, et al, Elect. Lett. 23, p. 403, April 1987)*

(Murata, et al, Elect. Lett. 24, p. 577, May 1988)

(Murata, et al, International Conference on Semiconductor Lasers, p. 132, Boston, September 1988)*

NTT ( Yoshikuni, et al, Elect. Lett. 22, p. 1153, October 1986)*

Toyko Institute of Technology (Tohmori, et al, Elect. Lett. 19, p. 656, August 1983)

(Tohmori, et al, Elect. Lett. 22, p. 138, January 1986)

Fujitsu (Kotaki, et al, Elect. Lett. 23, p. 324, March 1987)

(Kotaki, et al, Elect. Lett. 24, p. 503, April 1988)*

(Kotaki, et al, International Conference on Semiconductor Lasers, p. 128, Boston, September 1988)*

BTRL (Westbrook, Elect. Lett. 20, p. 957, November 1984)

Swedish Institute for Microelectronics

Broberg, et al, Appl. Phys. Lett. 52, p. 1295, April 1988)

We claim:

1. An improved tunable semiconductor laser comprising:

a monolithic semiconductor wafer made up of layers (C1, C2, C3, C4) whose thicknesses are superposed in a superposition direction, said layers extending and/or following one another in a longitudinal direction and in a transverse direction and constituting an internal longitudinal light guide (C2, C3) between confinement layers (C1, C4) having lower refractive indices in order to guide a light beam to be emitted, said light guide comprising:

an active layer (C2) having a forbidden energy band which is narrower than in the adjacent layers (C1, C3), and a grating layer (C3), first and second ones of said confinement layers (C1, C4) having opposite conductivity types so that electrical injection currents passing from one of said first and second confinement layers to the other pass through said light guide, injecting free carriers therein and consequently modifying its optical gain and its refractive index;

three sections of said plate following one another in said longitudinal direction as follows:

an amplification section (S1) in which the thickness of said active layer is suitable for amplifying said light and constitutes an amplification thickness;

a phase tuning section (S3); and a grating section (S2) which is situated at a first end of said plate and in which the thickness of said grating layer (C3) varies in alternation at a grating pitch along said longitudinal direction, thereby forming a distributed Bragg reflector grating (R) having an equivalent pitch for said light, said equivalent pitch being controllable by controlling the refractive index of a control layer (C2) of said light guide in said grating section;

said laser also comprising:

amplification electrodes (E1, EC) for injecting one of said injection currents into said amplification section, said current being an amplification current and being suitable for causing positive optical gain for said light to appear in said active layer;

phase tuning electrodes (E3, EC) for injecting one of said injection currents into said phase tuning section (S3), said current being a phase tuning current and being suitable for controlling the refractive index of said control layer (C2), thereby controlling the optical length for said light of said phase tuning section;

grating control electrodes (E2, EC) for injecting one of said injection currents into said grating section, said current being a grating control current suitable for controlling said equivalent pitch of said distributed reflector (R); and a second reflector (4) at a second end of said plate in order to constitute a laser oscillator suitable for emitting said light, thereby enabling a central frequency of said light to be controlled by the value of said grating control current and enabling stable monomode operation of said laser oscillator to be obtained by controlling said phase tuning current;

improvement whereby said active layer (C2) extends over at least one of said phase tuning section (S3) and said grating section (S2) in such a manner as to constitute said control layer therein, thereby widening the tuning range and/or reducing the spectrum line width of said laser.

2. A tunable semiconductor laser, comprising:

a monolithic semiconductor plate (2) extending along a longitudinal direction and constituted by layers (C1, C2, C3, C4) of various compositions and thicknesses, said thicknesses being superposed in a superposition direction, said layers extending and/or following one another along said longitudinal direction and along a transverse direction, and constituting:

an internal light guide (C2, C3) extending along said longitudinal direction and interposed in said superposition and transverse directions between confinement layers (C1, C4) having lower refractive indices so as to guide a light beam propagating along said longitudinal driection, said light beam itself including at least one active layer (C2) in which a forbidden energy band is narrower than in the adjacent layers (C1, C3), first and second ones (C1, C4) of said confinement layers having first and second conductivity types such that if electrical injection currents pass from one of these two layers to the other, said currents pass through said light guide causing densities of free carriers to appear therein suitable for giving rise to optical gain therein and/or for controlling a refractive index therein; and three sections which follow one another said longitudinal direction and which comprise:

an amplification section (S1) in which said active layer has an amplification thickness suitable for enabling said light to be amplified;

a phase tuning section (S3); and a grating section (S2) which is situated at a first end of said light guide and in which the thickness of the grating layer (C3) belonging to said light guide varies in alternation along said longitudinal direction in order to constitute a diffraction grating having a pitch and so that said grating contributes to forming a distributed Bragg reflector (R) for said light having a controllable equivalent pitch, with the ratio of said equivalent pitch to said grating pitch being controllable by means of the controllable refractive index of a control layer (C2) of said light guide in said grating section;

said laser also including:

amplification electrodes (E1, EC) disposed in said amplification section in order to cause an amplification current to pass, said current constituting one of said injection currents in order to cause positive optical gain to appear in said active layer (C2) suitable for creating and/or amplifying said light;

phase tuning electrodes (E3, EC) disposed in said phase tuning section (S3) in order to pass a phase tuning current which constitutes one of said injection currents for controlling the refractive index of said control layer (C2), thereby controlling the optical length of said phase tuning section relative to said light;

grating control electrodes (E2, EC) disposed in said grating section (S2) in order to pass a grating control current which constitutes one of said injection currents in order to control said equivalent pitch of said distributed reflector (R); and a second reflector (4) at a second end of said light guide at a distance from said grating section suitable for constituting a laser oscillator for emitting one of said light beams having a central frequency which can be controlled by means of the value of said grating control current, with stable monomode operation of said oscillator being obtainable by controlling a corresponding value of said phase tuning current;

said laser being characterized by the fact that said active layer (C2) extends in at least one of said phase tuning and grating sections (S3, S2) to constitute said control layer therein and confer a wider tuning range and/or a narrower spectrum line.

3. A laser according to claim 1, characterized by the fact that said active layer (C2) is of greater thickness than said amplification layer in at least one of said grating and phase tuning sections (S2, S3).

4. A laser according to claim 3, characterized by the fact that said active layer (C2) has said greater thickness in said grating and phase tuning sections (S2, S3) in order to constitute said control layers therein and to impart a widened continuous tuning range and a narrow spectrum line width to said laser.

5. A laser according to claim 4, in which said light guide (C2, C3) further includes a passive layer (C3) which extends along the entire length of said light guide and which constitutes said grating layer in said grating section (S2).

6. A laser according to claim 5, in which a first one of said confinement layers (C1) of a first one of said conductivity types, active layer (C2), said passive layer (C3), and a second one of said confinement layers (C4)

of an opposite second one of said conductivity types succeed one another in said superposition direction.

7. A laser according to claim 6, characterized by the fact that the thickness of said active layer (C2) in said phase tuning section (S3) is not less than 150% of said amplification thickness.

8. A laser according to claim 6, characterized by the fact that the thickness of said active layer (C2) in said phase tuning section (S3) is greater than 300 nm, said amplification thickness being less than 200 nm.

9. A laser according to claim 1, characterized by the fact that the thickness of said active layer (C2) in said phase tuning section (S3) lies between 15% and 25% of the wavelength of light suitable for being amplified in the material of said second layer present in said material.

10. A laser according to claim 3, characterized by the fact that it further includes electrical feed means (6) suitable for providing said amplification, phase tuning, and grating control currents at values suitable for ensuring said amplification in said amplification section (S1) and for avoiding amplification of said light in said phase tuning section (S3) and in said grating control section (S2).

* * * * *